United States Patent [19]
Bennett, Jr.

[11] Patent Number: 4,476,440
[45] Date of Patent: Oct. 9, 1984

[54] CROSS COUPLED AMPLIFIER

[75] Inventor: Robert M. Bennett, Jr., Ham Lake, Minn.

[73] Assignee: Medtronic, Inc., Minneapolis, Minn.

[21] Appl. No.: 305,996

[22] Filed: Sep. 28, 1981

[51] Int. Cl.³ .......................... H03F 3/45; H03F 1/38
[52] U.S. Cl. ................................... 330/260; 330/112
[58] Field of Search ............... 330/252, 260, 261, 259, 330/112

[56] References Cited

U.S. PATENT DOCUMENTS 3,848,139  11/1974  Holt, Jr. ............................. 330/252

FOREIGN PATENT DOCUMENTS 0470910  5/1975  U.S.S.R. ............................. 330/252
0614526  7/1978  U.S.S.R. ............................. 330/252
0690612  10/1979  U.S.S.R. ............................. 330/252

OTHER PUBLICATIONS

"Adaptive Biasing CMOS Amplifiers", by Degrauwe et al., Jun., 1982.
"An Open Loop Programmable Amplifier with Extended Frequency Range", by Blauschild, Dec., 1981.

Primary Examiner—James B. Mullins
Assistant Examiner—G. Wan
Attorney, Agent, or Firm—Merchant, Gould, Smith, Edell, Welter & Schmidt

[57] ABSTRACT

An improved differential amplifier includes two Darlington transistor pairs (44–45, 46–47) connected to form a Darlington differential amplifier having complementary sides. Two cross-coupling transistors (50, 52) connect thereto for providing complementary positive feedback of gain less than one between the sides. The cross-coupling transistors significantly improve the differential gain and differential input resistance of the Darlington amplifier.

9 Claims, 5 Drawing Figures

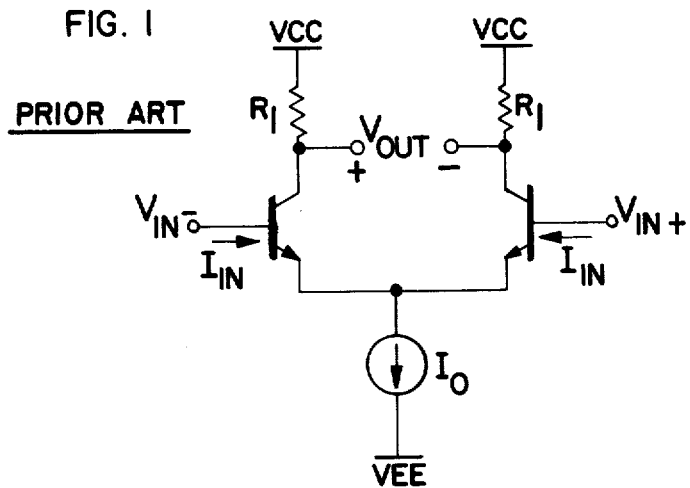
FIG. 1 PRIOR ART
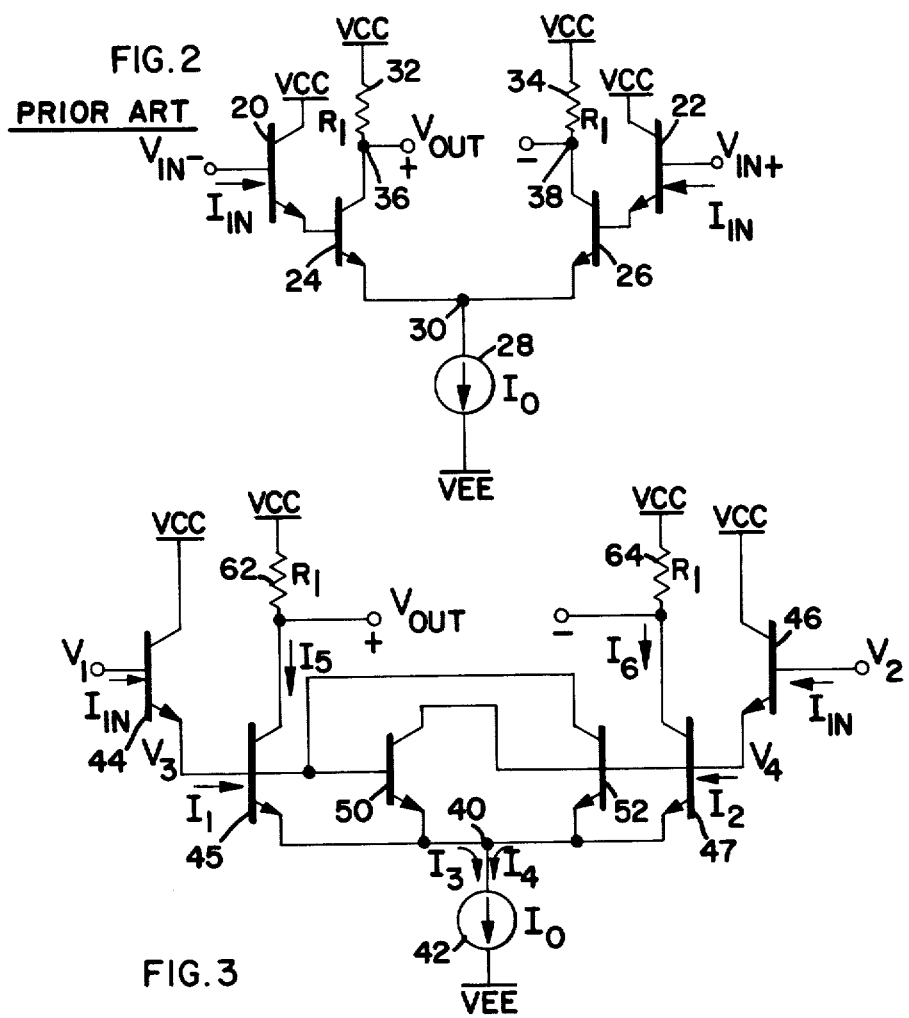
FIG. 2 PRIOR ART
FIG. 3

CROSS COUPLED AMPLIFIER

TECHNICAL FIELD OF THE INVENTION

The present invention relates to the field of differential pair amplifiers, and more specifically to a new differential amplifier circuit for providing improved transconductance and input impedance characteristics.

BACKGROUND OF THE PRIOR ART

Differential amplifiers function, in general, to amplify the difference between two signals. They are used in a wide variety of measurement applications where response from DC to many megahertz is required. In addition, differential amplifiers are the basic stage of integrated operational amplifiers with differential inputs.

While there are a wide variety of differential amplifier circuit topologies, most, if not all, include a constant current source, two load resistors and symmetrical transistors input stages for splitting the constant current between the load resistors. Usually, the output voltage is taken as the difference in the voltage drops across the load resistors; in this manner, large variations in output voltages may be achieved with extremely small input voltage differentials. One such amplifier, and perhaps the simplest, is the symmetrical emitter-coupled differential amplifier. This amplifier topology comprises two transistors having their emitters connected to a current source, their collectors each tied to a positive potential, possibly through an equivalent load resistance, with the output taken in the form of a current from the collectors which is related to the input potential difference between the two bases. The collector current is most often converted to a voltage by the load resistance. The circuit makes an excellent differential amplifier if the emitter resistance is kept relatively large.

For all differential amplifiers there are associated therewith certain differential voltage gain and input resistance performance characteristics. These characteristics and others determine the usefulness of the amplifier in any given application. For example, some applications may require an amplifier with a high input impedance and moderate gain, and vice versa. For the simple emitter-coupled differential amplifier, differential voltage gain is directly proportional to the level of the constant current ($I_o$), and the load resistance ($R_1$); differential input resistance is directly proportional to the input transistor $\beta$ and inversely proportional to $I_o$. Therefore, in order to increase the gain without changing $R_1$ and thereby degrading the output impedance, $I_o$ must be increased, giving rise to an undesirable decrease in input resistance.

One well-known modification to the basic differential amplifier that provides for increased input resistance is the addition of a single transistor to each side to form a Darlington pair. This Darlington differential amplifier topology provides a differential input resistance which, compared to differential input resistance of the simple emitter-coupled type of amplifier, is a factor of $\beta$ larger. As a result, differential gain may be improved, by increasing $I_o$, while maintaining a relatively high differential input resistance.

While the two foregoing topologies provide adequate performance for most applications, improvements in the differential gain and input impedance characteristics of differential amplifiers have been a constant goal for designers. Accordingly, there exist numerous differential amplifier designs, each attempting to maximize certain performance characteristics. However, until now there have been no significant improvements in differential amplifier performance without relatively large increases in their corresponding degree of complexity, usually requiring multiple stages with increased power dissipation. As a result these improvements have had limited usefulness, especially in designs where power consumption and space limitations are critical.

SUMMARY OF THE INVENTION

Unlike the above-mentioned prior art improvements, the present invention provides for a significant increase in differential gain and greatly improved differential input resistance with the addition of only two transistors to the basic Darlington pair differential amplifier topology. In accordance with the present invention, this improved differential amplifier preferably comprises two Darlington transistor pairs connected to form complementary sides of a differential amplifier with two cross-coupling transistors connected to provide complementary positive feedback of gain less than one between the sides.

According to another aspect of the present invention, there is provided negative input impedance. This and other characteristics give the present invention wide application possibilities, including uses in high frequency limiter amps, comparator input stages, programmable Schmitt triggers, automatic gain controllers, implantable devices, and any other application where the improved characteristics of the present invention may be advantageously utilized.

BRIEF DESCRIPTION OF THE DRAWING

In the drawing:

FIG. 1 is a schematic illustration of a prior art simple emitter-coupled differential amplifier;

FIG. 2 is a schematic illustration of a prior art Darlington pair differential amplifier;

FIG. 3 is a schematic illustration of a cross-coupled amplifier according to the present invention;

DETAILED DESCRIPTION OF THE PREFERRED EMBODIMENT

Figure 4:
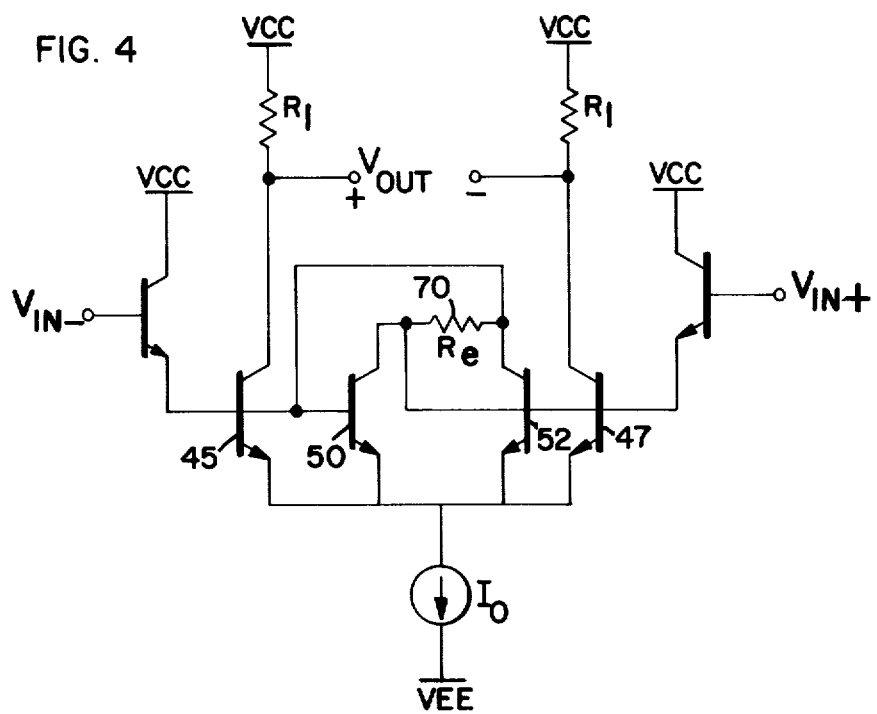
FIG. 4 is a schematic illustration of an alternative embodiment of a cross-coupled amplifier according to the present invention.

In order to facilitate the understanding of the present invention's advantages, a short review of the basic differential pair differential amplifier and common Darlington differential amplifier is provided herein. FIG. 1 shows a simple differential pair differential amplifier having a constant current source, which sinks a constant current $I_o$, connected to its tail. The amplifier's differential input voltage, $V_d$, is defined as:

$$V_d = V_{in-} - V_{in+} \tag{1}$$

The amplifier's small signal differential gain $Av_d$, which is the ratio of the change in the output voltage $V_{out}$ to the change in the input voltage $V_d$, is then expressed by:

$$A v_d = \frac{dV_{out}}{V_d} = \frac{qR_LI_o}{2KT} \quad (2)$$

Similarly, the amplifier's differential input resistance is expressed as the ratio between incremental changes in $V_d$ to incremental changes in $I_{in}$. This relationship may be expressed as:

$$\frac{dV_d}{dI_{in}} = \frac{4KT\beta}{qI_o} \quad (3)$$

Finally, if driven with a source resistance $R_s$, the amplifier's gain becomes:

$$\text{Gain}_{R_s} = \left[\frac{4KT\beta}{4KT\beta + R_s}\right]\left[\frac{qR_LI_o}{2KT}\right] \quad (4)$$

FIG. 2 shows the differential amplifier of FIG. 1 with a Darlington input modification. The differential gain for this circuit may be given as:

$$A v_{dD} = \frac{dV_{out}}{dV_d} = \frac{qR_LI_o}{4KT} \text{ Where } \frac{KT}{8} = .026 \quad (5)$$

It is seen, then, that for the same values of $R_1$ and $I_o$ the differential gain of this circuit is only half of that for the circuit of FIG. 1. (Note: this problem can be eliminated by inserting current sources from the input transistor emitter to ground, at the expense of increased supply current and added complexity.) However, the differential input resistance is greatly improved:

$$\frac{dV_d}{dI_{in}} = \frac{8kT\beta^2}{qI_o} \quad (6)$$

This improvement is due primarily to the circuit's $\beta^2$ dependence. Finally, the gain for this amplifier, when driven with a source resistance $R_s$, is:

$$\text{Gain}_{R_s} = \left[\frac{\frac{8KT\beta^2}{qI_o}}{\frac{8KT\beta^2}{qI_o} + R_s}\right]\left[\frac{qR_LI_o}{4KT}\right] = \quad (7)$$

$$\frac{qR_LI_o}{4KT} \text{ FOR LARGE } \beta$$

As evidenced above, source resistance $R_s$ has parasitic effect on the gain of either differential amplifier. If, for example, the simple differential pair differential amplifier of FIG. 1 is driven with a voltage source having a source resistance given by:

$$R_s = \frac{8KT}{qI_o} \quad (8)$$

and a nominal $\beta$ value of 100, the gain drops by approximately 2%:

$$A v_d = [\beta/\beta + 2]\left[\frac{qR_LI_o}{2KT}\right] \approx \frac{qR_LI_o}{2KT} \quad (9)$$

Similarly, the Darlington differential AMPs gain drops by about 0.01%:

$$A v_{dD} = \left[\frac{\beta^2}{\beta^2 + 1}\right]\left[\frac{qR_LI_o}{4KT}\right] \approx \frac{qR_LI_o}{4KT} \quad (10)$$

An improved amplifier according to the present invention is schematically illustrated in FIG. 3. Input voltages $V_1$ and $V_2$ are applied to the respective bases of transistors 44 and 46. The collectors of transistors 44 and 46 are both connected to a positive potential VCC. The emitter of transistor 46 is connected to the base of transistor 47, the base of transistor 52, and the collector of transistor 50. The emitter of transistor 44 is similarly connected to the base of transistor 45, the base of transistor 50, and the collector of transistor 52. The emitters of transistors 45, 50, 52, and 47 are connected together and tied to constant current source 42, which in turn is connected to a negative potential VEE. The collectors of transistors 45 and 47 are connected to one end of the respective load resistors 62 and 64. The other ends of both resistors 62 and 64 are connected to the positive potential VCC. The output $V_{out}$ is taken across the collector ends of load resistors 62 and 64.

Turning to FIG. 3, the operation of the present invention will now be explained. With the exception of the symmetrical "cross-coupling" transistors 50 and 52, the circuit of FIG. 3 is identical to that of FIG. 2. However, this addition provides significant deviation in the circuit's input impedance and gain characteristics. Equal input voltages $V_1$ and $V_2$ produce equal currents $I_1$ and $I_2$. Currents $I_1$ and $I_2$ are very nearly equal the respective currents $I_6$ and $I_5$ due to the identical nature of transistor pairs 45 and 50, and 52 and 47. Therefore, tail current $I_o$, which is the sum of currents $I_3$ and $I_4$, is composed of the very nearly equal currents $I_1$, $I_2$, $I_5$, and $I_6$. If voltage $V_1$ is then increased, voltage $V_3$ will tend to follow it. An increase in voltage $V_3$ increases the $V_{be}$ (base to emitter voltage) of transistors 45 and 50. This has two effects, the first being an increase in current $I_5$ and the second being a corresponding increase in the current $I_2$. As current $I_2$ increases, the $V_{be}$ of transistor 46 increases, thereby resulting in a corresponding further decrease in voltage $V_4$. The lowering of voltage $V_4$ has the effect of decreasing the $V_{be}$ voltages of transistors 47 and 52, thereby reducing currents $I_6$ and $I_1$ by equal amounts. Furthermore, as current $I_1$ decreases, the $V_{be}$ voltage of transistor 44 also decreases, and in order to keep the voltage drop from input $V_1$ to node 40 constant, the voltage across the $V_{be}$ of transistors 45 and 50 has a further tendency to increase and thereby cause another increase in currents $I_5$ and $I_2$. So, unlike the Darlington differential amplifier illustrated in FIG. 2, in which an increase in the active condition of one side gives rise to a nearly equal decrease in the active condition of the other side, the present invention amplifies the decrease in the active condition of the other side, and thereby provides for improved gain. Even though this is a positive feedback scheme, the overall gain is less than one due to finite $\beta$, and therefore stability is not a problem. On the contrary, this positive feedback improves differential gain by enhancing or accentuating the effects of a small input voltage differential. It will be seen, then, that the addition of transistors 50 and 52 to the circuit of FIG. 2 greatly enhances its gain performance by providing a complementary positive feedback between the sides of the amplifier.

A theoretical derivation of transconductance (gain) and input resistance for the present invention will now be given. Before beginning, it is important to note that the theoretical basis of the present invention's operation is due to second order effects and therefore these effects must be accounted for in the analysis. The currents through resistors 62 and 64 may given as follows:

$$I_5 = \frac{\beta I_3}{2(\beta + 1)} \quad (11)$$

$$I_6 = \frac{\beta I_3}{2(\beta + 1)} \quad (12)$$

The differential input voltage $V_d$ is:

$$V_d = V_1 - V_2 = \frac{KT}{q} \ln\left[\frac{\beta I_4(I_o - I_4)/2 + I_4}{\beta I_4(I_o - I_4)/2 + (I_o - I_4)}\right] \quad (13)$$

With transconductance (with respect to $I_4$) given as:

$$g_{mI4} = \frac{dI_4}{dV_d} = \frac{(\beta + 2)I_o}{16KT/q} \quad (14)$$

The total transconductance to the output collector of transistor 48 is then:

$$g_{mT} = \beta/2(\beta + 1) g_{mI4} = \frac{\beta I_o}{32KT/q}\left(\frac{\beta + 1}{\beta + 1}\right) \approx \frac{\beta I_o}{32KT/q}, \text{ For high } \beta \quad (15)$$

Given load resistance $R_L$ the differential gain is simply:

$$A_{Vdc} = \frac{dV_{out}}{dV_d} \approx \frac{q\beta R_L I_o}{16KT} \text{ Where } \frac{KT}{q} \approx .026, \beta \gg 1 \quad (16)$$

Input resistance may be expressed as:

$$1/R_{in} = \frac{dI_{in}}{dV_d} = \quad (17)$$

$$\left[\frac{dI_4}{dV_d}\frac{\beta/2}{\beta+1} + \frac{dI_3}{dV_d}(1/\beta + 1)\right] 1/(\beta + 1)^2 =$$

$$\left[-g_{mT} + \frac{g_{mI4}}{\beta + 1}\right] 1/2(\beta + 1)$$

Therefore, for high $\beta$, this *negative* input impedance becomes:

$$R_{in} = \frac{-16KT/q}{I_o} \quad (18)$$

While in general a negative input impedance of this type can also be provided using tunnel diodes, tunnel diodes are difficult to bias and hard to control. On the contrary, the present invention provides a negative input impedance easily biased and easily controlled by the tail current ($I_o$), and negative input impedance can be quite useful. One major advantage of negative input impedance is seen when considering the gain of the present invention if driven with a source resistance $R_s$. For $R_s < 16KT/qI_o$, gain is given as follows:

$$\text{Gain}_{Rs} = \left[\frac{1}{1 - \frac{qR_sI_o}{16KT}}\right]\left[\frac{q\beta R_L I_o}{16KT}\right] \quad (19)$$

It is easily seen that an increase in $R_s$ gives yield to an increase in gain. This is in direct contrast to the corresponding gain performance of the simple differential pair and Darlington differential amplifiers, in which an increase in $R_s$ results in a decrease in gain. For instance, for the same source resistance $R_s = 8KT/qI_o$, the gain of the present invention *increases* by a factor of 2, while that of the differential pair drops by approximately 2% (equation 9), and that of the common Darlington by 0.01% (equation 10).

Improvement in the present invention's differential gain may also be illustrated by making comparison to the simple differential pair and the Darlington differential amplifiers. Taking the ratio of equation 16 to that of equation 2 we get:

$$\frac{A_{Vdc}}{A_{Vd}} = \left[\frac{q\beta R_L I_o}{16KT}\right]\left[\frac{2KT}{qR_L I_o}\right] = \beta/8 \quad (20)$$

Thus, for a nominal $\beta = 100$, the gain of the present invention is improved by a factor of 12.5 over that of the differential pair shown in FIG. 1. Even greater improvement is seen when comparing the gain of the present invention to the gain of the common Darlington differential amplifier shown in FIG. 2. Taking the ratio of equation 16 to that of equation 5 we get:

$$\frac{A_{Vdc}}{A_{VdD}} = \left[\frac{q\beta R_L I_o}{16KT}\right]\left[\frac{4KT}{qR_L I_o}\right] = \beta/4 \quad (21)$$

In this case for a nominal $\beta = 100$ the gain is improved by a factor of 25.

It will be seen from the foregoing then that when driven through the appropriate source resistance the present invention easily provides gains an order of magnitude better than those of conventional differential amplifiers without increased power dissipation.

Figure 5:
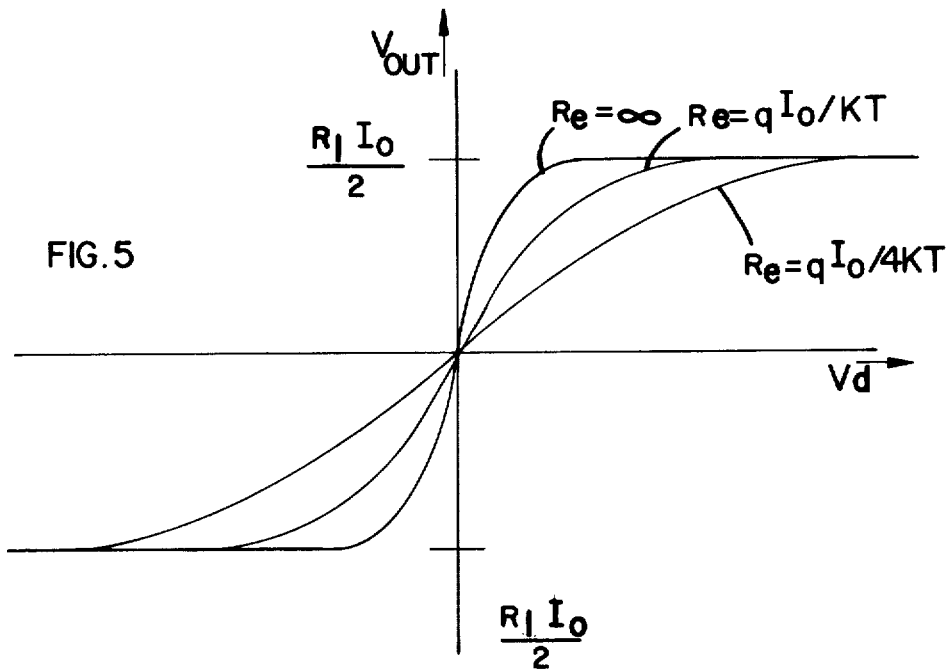
FIG. 5 is a graph showing the gain response of the present invention for three different values of feedback resistance.

An alternative embodiment of the present invention is shown in FIG. 4. The circuit is identical to the circuit of FIG. 3 but has the additional feedback resistor 70 ($R_e$) which is connected on one end to the collector of transistor 50, and the bases of transistor 52 and 47, and on the other end to the collector of transistor 52 and the corresponding bases of transistors 45 and 50. As will be explained, this embodiment of the present invention provides for gain control using resistance 70 to reduce the amount of positive feedback provided by transistors 50 and 52. The plots of output voltage $V_{out}$ against input voltage $V_d$, or gain, for three values of $R_e$ are depicted in FIG. 5. As indicated by the plot denoted by $R_e = \infty$, the highest gain is obtained in the absence of feedback. As the two other plots indicate, as $R_e$ decreases, the gain is reduced, thereby making it less susceptible to $\beta$ variations. Another effect of this negative feedback is an increase in the value of the negative input resistance, which results in a corresponding decrease in the susceptibility of the gain to input loading. Surprisingly, as FIG. 5 demonstrates, the limiting characteristics of the present invention do not vary in response to the value of the feedback resistance. This means that the transfer characteristic maintains its functional form (not linearized as would be the case for standard emitter degeneration) until the amplifier saturates. This property of the present invention makes it potentially useful as a limiter amplifier in an FM IF system or in a signal compression circuit.

Another potential use for the present invention is in the input stage of a comparator; the amplifier's positive feedback increasing differential transconductance and improving response time. Still other potential uses exist in the areas of automatic gain control and programmable triggers. In fact, potential uses for the present invention exist anywhere differential amplifiers are now used. In addition to this myriad of potential uses, the present invention is particularly useful in applications where space and power consumption are critical, such as for implantable medical devices. Because of its much-improved gain performance, the present invention allows for the elimination of relatively complex gain boosting stages. The result is better or comparable gain performance with less power consumption and corresponding improvements in battery and device life.

Although the preferred embodiment of the present invention is shown using npn bipolar technology, it will be seen that the invention may be practiced with pnp bipolar and FET technologies, the topology for either being readily derived from the small signal models associated with the npn embodiment. Furthermore, it will be seen that the present invention may be practiced using either discrete or integrated designs.

What is claimed is:

1. An improved differential amplifier comprising:
   two Darlington transistor pairs;
   a constant current circuit and means for connecting it with said Darlington transistor pairs to form a differential amplifier with the two Darlington pairs forming the opposite sides of said amplifier; and
   cross-coupling transistors and means for connecting said cross-coupling transistors between the opposite sides of said amplifier to provide complementary positive feedback of gain less than one between said sides and to cause said differential amplifier to have a negative input impedance.

2. An improved differential comprising:
   two Darlington transistor pairs, each pair including an input transistor and an output transistor;
   a constant current circuit and means for connecting said output transistors and said constant current circuit to form a differential amplifier; and
   a pair of cross-coupling transistors connected between said Darlington transistor pairs to provide complementary positive feedback of gain less than one between said pair, said positive feedback functioning to amplify the decrease in the active condition of one side of said amplifier which occurs in response to an increase of the active condition of the other side without destabilizing said amplifier, and functioning to cause said amplifier to have a negative input impedance.

3. An improved bipolar differential amplifier comprising:
   two bipolar Darlington transistor parts, each pair including an input transistor and an output transistor;
   a constant current circuit and means for connecting it with said Darlington transistor pairs so that said Darlington transistor pairs form complementary sides of a differential amplifier; and
   a pair of bipolar cross-coupling transistors connected to interact with said Darlington pairs to provide complementary positive feedback of gain less than one between said pairs, and to provide a total transconductance $gm_T \cong \beta I/32KT/q$ and an input impedance $R_{in} \cong -16KT/q/I$, for high values of $\beta$ and wherein I = the constant current provided by said constant current circuit.

4. An improved differential amplifier comprising:
   two Darlington transistor pairs;
   constant current circuit means connected with said Darlington transistor pairs to form a differential amplifier; and
   a pair of cross-coupling transistors connected between the sides of said differential amplifier to provide a cross transconductance of gain less than one between said transistor pairs and to cause said amplifier to have a negative input impedance.

5. An improved bipolar differential amplifier comprising:
   two Darlington npn transistor pairs, each pair including an input transistor and an output transistor;
   a constant current circuit and means for connecting it with the emitters of said output transistors to form a differential amplifier;
   a pair of cross-coupling npn transistors each having its base connected to the other's collector and having its emitter connected to the emitter-emitter junction of said output transistors; and
   means connecting the base electrode of one of said cross-coupling transistors to the emitter-base junction of one of said Darlington transistor pairs and connecting the base of the other of said cross-coupling transistors to the emitter-base junction of the other of said Darlington pairs to provide a complementary positive feedback of gain less than one between the sides of said differential amplifier and to cause said amplifier to have a negative input impedance.

6. An improved differential amplifier comprising:
   two Darlington npn transistor pairs, each including an input transistor and an output transistor;
   a constant current circuit connected to the emitter of each output transistor of said Darlington pairs to form a differential amplifier;
   a first cross-coupling npn transistor having its base connected to the base of one of said output transistors and having its collector connected to the base of the other of said output transistors;
   a second cross-coupling npn transistor having its base connected to the collector of said first cross-coupling transistor and having its collector connected to the base of said first cross-coupling transistors;
   means connecting the emitters of said cross-coupling transistors to the emitters of said output transistors to provide a complementary positive feedback voltage gain of less than one between said pairs.

7. An improved differential amplifier comprising:
   first and second npn input transistors;
   first and second npn output transistors;
   means for connecting the emitters of said first and second input transistors to the respective bases of said first and second output transistors;

a first npn cross-coupling transistor and means connecting its base to the base of said first output transistor and connecting its collector to the base of said second output transistor;

a second npn cross-coupling transistor and means connecting its base to the base of said second output transistor and connecting its collector to the base of said first output transistor;

constant current generating means connected to the emitters of said output and cross-coupling transistors to provide a cross-coupled Darlington differential amplifier having negative input impedance.

8. An improved differential amplifier according to claim 7 including a feedback resistor connected between the collector electrodes of said cross-coupling transistors.

9. An improved bipolar differential amplifier comprising:

two bipolar Darlington transistor pairs, each pair including an input transistor and an output transistor, the emitter of the input transistor connected to the base of the output transistor;

constant current circuit means connected with said Darlington transistor pairs to form a differential amplifier; and a pair of bipolar cross-coupling transistors, the base of one of said cross-coupling transistors connected to the base of one of said output transistors and the base of the other of said cross-coupling transistors connected to the base of the other of said output transistors, each of said cross-coupling transistors being further connected as between each other to provide an emitter-collector current path between the base of the other and said constant current circuit means to provide a complementary positive feedback of gain less than one between the sides of said differential amplifier and to cause said amplifier to have a negative input impedance.

* * * * *

UNITED STATES PATENT AND TRADEMARK OFFICE
CERTIFICATE OF CORRECTION

PATENT NO. : 4,476,440

DATED : October 9, 1984

INVENTOR(S) : Robert M. Bennett, Jr.

It is certified that error appears in the above-identified patent and that said Letters Patent is hereby corrected as shown below:

Column 1, line 20-21

"transistors" should be --transistor--

Column 3, line 37

"8kTB$^2$" should be --8KTB$^2$--

Column 5, line 29

"48" should be --47--

Column 7, line 57

"pair" should be --pairs--

Signed and Sealed this

Second Day of July 1985

[SEAL]

Attest:

DONALD J. QUIGG

Attesting Officer     Acting Commissioner of Patents and Trademarks